(12) United States Patent
Cheng et al.

(10) Patent No.: US 7,285,494 B2
(45) Date of Patent: Oct. 23, 2007

(54) MULTIPLE STAGE ELECTROLESS DEPOSITION OF A METAL LAYER

(75) Inventors: Chin-Chang Cheng, Portland, OR (US); Valery M. Dubin, Portland, OR (US)

(73) Assignee: Intel Corporation, Santa Clara, CA (US)

(*) Notice: Subject to any disclaimer, the term of this patent is extended or adjusted under 35 U.S.C. 154(b) by 79 days.

(21) Appl. No.: 11/192,501

(22) Filed: Jul. 29, 2005

(65) Prior Publication Data

US 2005/0266265 A1    Dec. 1, 2005

Related U.S. Application Data

(63) Continuation of application No. 10/744,119, filed on Dec. 22, 2003, now Pat. No. 7,049,234.

(51) Int. Cl.
*H01L 21/44* (2006.01)

(52) U.S. Cl. .............. 438/687; 438/680; 438/692; 257/E21.17; 257/E21.229; 257/E21.174; 257/E21.304

(58) Field of Classification Search .......... 438/687, 438/680, 683, 685, 686, 692, 723, 724, 743, 438/744, 755, 756, 785, 650, 656
See application file for complete search history.

(56) References Cited

U.S. PATENT DOCUMENTS

| | | | | |
|---|---|---|---|---|
| 5,660,883 | A * | 8/1997 | Omura | 427/304 |
| 5,925,415 | A * | 7/1999 | Fry et al. | 427/304 |
| 6,645,557 | B2 * | 11/2003 | Joshi | 427/304 |
| 6,780,456 | B2 * | 8/2004 | Kunishi et al. | 427/58 |
| 6,861,097 | B1 * | 3/2005 | Goosey et al. | 427/304 |

* cited by examiner

*Primary Examiner*—David Nhu
(74) *Attorney, Agent, or Firm*—Blakely, Sokoloff, Taylor & Zafman LLP

(57) ABSTRACT

A multiple stage method of electrolessly depositing a metal layer is presented. This method may have the two main stages of first forming a thin metal layer on a metal surface using an electroless plating solution containing activating agents that are highly reactive reducing agents, and second, forming a bulk metal layer over the thin metal layer by using an electroless plating solution containing mildly reactive reducing agents. Through this two stage method, the use of highly reactive reducing agents that may cause the formation of contaminant particles may be minimized. By minimizing the formation of contaminant particles in the electroless plating solution, the lifetime of the solution may be extended and the current leakage between metal interconnect lines may be reduced.

7 Claims, 6 Drawing Sheets

MULTIPLE STAGE ELECTROLESS DEPOSITION OF A METAL LAYER

The present patent application is a Continuation of Application Ser. No. 10/744,119, filed Dec. 22, 2003 now U.S. Pat. No. 7,049,234.

BACKGROUND OF THE INVENTION

1. Field of the Invention

The present invention relates to the field of electroless plating, and more particularly to the application of electroless plating to the fabrication of interconnect structures in semiconductor devices.

2. Discussion of Related Art

The interconnect lines of integrated circuits may be formed with any highly conductive material such as the conductive metals aluminum, copper, and gold. Copper, in particular, has become widely used to form interconnect lines. But, a drawback to using copper and other similar materials is that diffusion of the metal may occur. The metal atoms may diffuse out of the confines of the interconnect line and into the surrounding materials such as the dielectric. This diffusion may cause shorts and ultimately the failure of devices.

The electromigration of the metal used to form the interconnect lines may be countered by forming a diffusion barrier layer containing cobalt substantially surrounding the interconnect lines or capping the interconnect lines. The cobalt diffusion barrier layer may typically be formed by electroless deposition. Electroless plating is a process for depositing a layer of material onto a surface by the chemical reduction of an electrolytic solution in the absence of an external electric current. The electroless plating is typically performed by immersing the subject to be plated into an electroless bath solution. The electroless bath solution for the plating of a cobalt layer may contain cobalt ions that may be provided by cobalt chloride ($CoCl_2$) or cobalt sulfate ($CoSO_4$), a complexing agent such as citric acid, a buffer agent such as ammonium chloride ($NH_4Cl$) or ammonium sulfate ($(NH_4)_2SO_4$), a reducing agent such as hypophosphite, and a pH adjuster such as tetramethylammonium hydroxide (TMAH). In using such a solution it may be necessary to activate the metal to be plated before applying the electroless solution. The metal may be activated by depositing a noble metal catalytic layer such as platinum or palladium on the metal lines. But, this noble metal catalytic layer may increase the resistance of the interconnect lines and cause current leakage. For example, a palladium noble metal layer may result in a 20%-50% increase in copper interconnect line resistance.

Active agents such as the reducing agents dimethylamine borane (DMAB) and borohydrate may be placed in the electroless plating bath to avoid the use of a noble metal catalytic layer. These active agents are highly reactive and serve to catalyze the deposition of the diffusion barrier onto the metal. But, these activation agents such as DMAB and borohydrate may be so reactive that they can dramatically shorten the effective lifetime of the electroless plating bath and may also cause the formation of large particles in the electroless plating bath that may deposit on the metal. Active agents such as DMAB and borohydrate tend to react with the metal particles in the electroless plating solution, and then those particles react with other particles, and so on, until very large metal particles are formed. These large metallic particles may deposit onto the metal being plated and cause current leakage between the interconnect lines leading to shorts and the ultimate breakdown of a device.

DETAILED DESCRIPTION OF THE PRESENT INVENTION

Described herein are methods of forming a metal layer by a multiple stage electroless deposition. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art. In other instances, well known semiconductor fabrication processes, techniques, materials, equipment, etc., have not been set forth in particular detail in order to not unnecessarily obscure embodiments of the present invention.

A multiple stage method of electrolessly depositing a metal layer is presented. This method may have the two main stages of first forming a thin metal layer on a metal surface using an electroless plating solution containing activating agents that are highly reactive reducing agents, and second, forming a bulk metal layer over the thin metal layer by using an electroless plating solution containing mildly reactive reducing agents. Through this two stage method, the use of highly reactive reducing agents that may cause the formation of contaminant particles may be minimized. By minimizing the formation of contaminant particles in the electroless plating solution, the lifetime of the solution may be extended and the current leakage between metal interconnect lines may be reduced.

Figure 1:
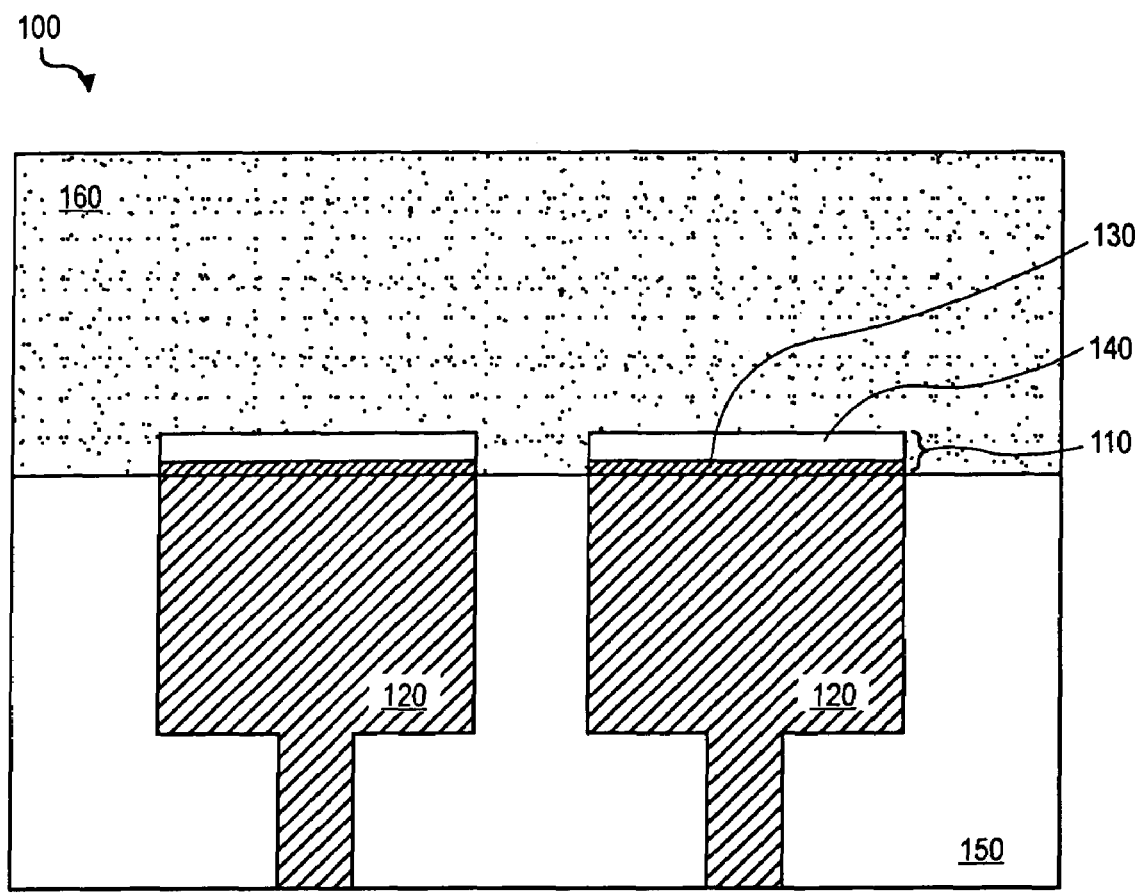
FIG. 1 is an illustration of a cross-sectional view of one layer of metallization within integrated circuit where a capping layer has been deposited using the multiple stage electroless deposition method.

The metal layer deposited by the multiple stage electroless deposition method may be a capping layer 110 of the top surfaces of metal interconnect lines 120 of an integrated circuit 100, as illustrated in FIG. 1. The metal interconnect lines may be copper and formed within a dielectric layer 150. In an embodiment, the capping layer 110 may have two metal layers distinct from one another in that the first metal layer 130 contains boron and the second metal layer 140 does not contain boron. The first metal layer 130 may be deposited onto the metal interconnect lines 120 by an electroless plating solution including boron-containing reducing agents that may cause boron to become part of the first metal layer 130. In an embodiment, the first metal layer 130 may be a thin film having a thickness of less than approximately 50 angstroms. The second metal layer 140 may be deposited onto the first metal layer by an electroless plating solution that does not include boron-containing reducing agents, and thus the second metal layer 140 may not contain boron. In an embodiment, the second metal layer 140 has a thickness in the approximate range of 50 angstroms and 500 angstroms. Therefore, the ratio of thicknesses of the first metal layer 130 to the second metal layer 140 may be from approximately 1:1 to approximately 1:10. Both the first metal layer 130 and the second metal layer 140 may be formed of the same type of metal. In one embodiment, the metal forming both the first metal layer 130 and the second metal layer 140 may be cobalt or a cobalt alloy such as CoW, CoCr, CoRe, or CoMo, with minor constituents such as (P) phosphorous or (B) boron that may be deposited from the reducing agents. In one particular embodiment, the first metal layer 130 is CoB and the second metal layer 140 is CoP. In an alternate embodiment, the first metal layer 130 may be formed of a different metal than the second metal layer. An interlayer dielectric (ILD) 160 may be formed above the metal capping layer 110 and the dielectric layer 150.

Figure 2A:
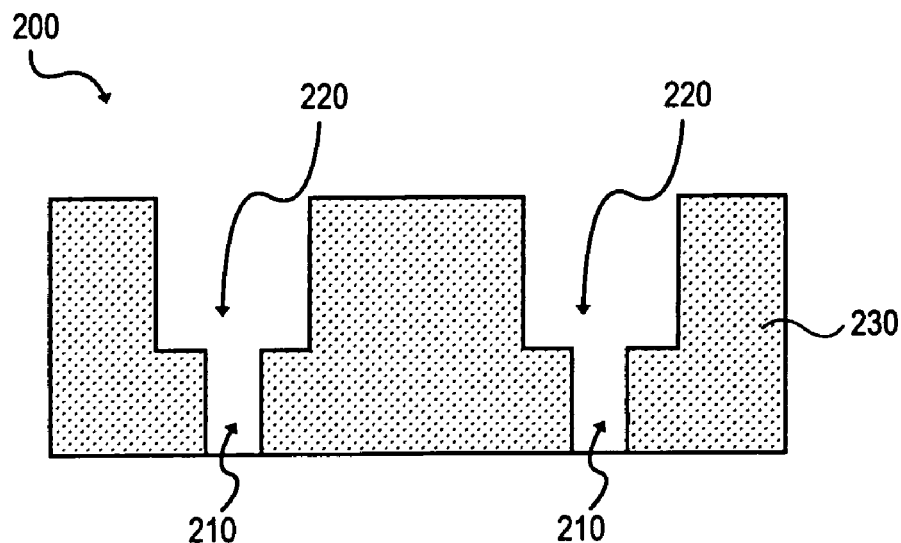
FIGS. 2a-2i are illustrations of a method including the multiple stage electroless deposition method.
Figure 2B:
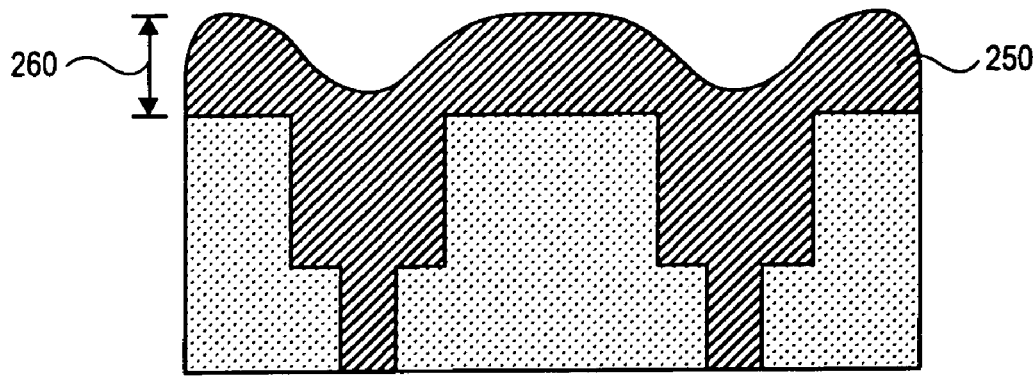
Figure 2C:
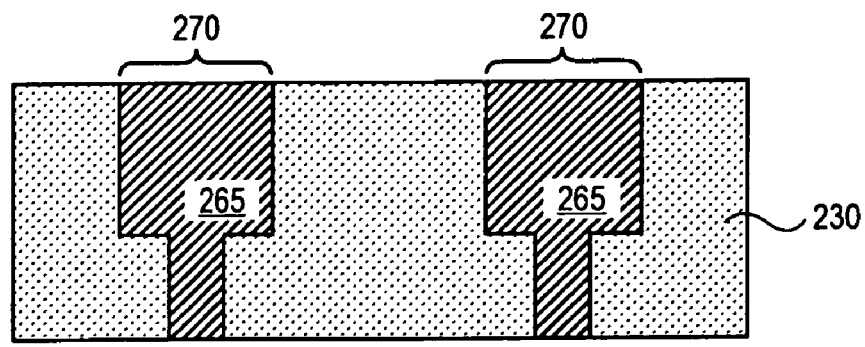

The metal interconnect lines 120 may be formed by a dual damascene method illustrated in FIGS. 2a-2b. Forming metal interconnects in a dielectric by a dual damascene method is also at block 310 of the flow chart of FIG. 3. FIG. 2a illustrates a dual damascene structure 200 after vias 210 and trenches 220 have already been etched into dielectric layer 230. A barrier layer or a seed layer 240 may optionally be formed over the patterned dielectric layer 130 by methods such as physical vapor deposition (PVD), chemical vapor deposition (CVD), electroplating, or atomic layer deposition (ALD). The barrier layer 240 may be a material such as tantalum, tantalum nitride, titanium silicon nitride, or ruthenium if it is a barrier layer, or a material such as copper or a copper alloy if it is a seed layer. In an alternate embodiment, the barrier layer 240 may be the metal layer described above having a thin first layer containing boron and a second bulk layer that does not contain boron. FIG. 2b illustrates the dual damascene structure after the vias 210 and trenches 220 have been filled with copper 250. The excess copper layer 260 is then polished using chemical mechanical polishing (CMP) at block 320, resulting in the planarized dual damascene structure illustrated in FIG. 2c. After CMP, copper interfaces 270 and the dielectric layer 230 are exposed at the top of the copper interconnect lines 265. A multiple stage electroless plating method may then be used to form a metal capping layer on the copper interfaces 270.

Before forming the metal capping layer on the copper interfaces 270 the copper interfaces 270 and the surface of the dielectric layer 230 may be pre-cleaned at block 330 with a mild acid solution to remove post-CMP residue. The mild acid solution may be dilute sulfuric acid ($H_2SO_4$), citric acid, or hydrofluoric acid (HF) in water.

The metal interconnect lines 120 may be formed by a dual damascene method illustrated in FIGS. 2a-2b. Forming metal interconnects in a dielectric by a dual damascene method is also at block 310 of the flow chart of FIG. 3. FIG. 2a illustrates a dual damascene structure 200 after vias 210 and trenches 220 have aleady been etched into dielectric layer 230. A barrier layer or a seed layer 240(not shown) may optionally be formed over the patterned dielectric layer 130 by methods such as physical vapor deposition (PVD), chemical vapor deposition (CVD), electroplating, or atomic layer deposition (ALD). The barrier layer 240 may be a material such as tantalum, tantalum nitride, titanium silicon nitride, or ruthenium if it is a barrier layer, or a material such as copper or a copper alloy if it is a seed layer. In an alternate embodiment, the barrier layer 240 may be the metal layer described above having a thin first layer containing boron and a second bulk layer that does not contain boron. FIG. 2b illustrates the dual damascene structure after the vias 210 and trenches 220 have been filled with copper 250. The excess copper layer 260 is then polished using chemical mechanical polishing (CMP) at block 320, resulting in the planarized dual damascene structure illustrated in FIG. 2c. After CMP, copper interfaces 270 and the dielectric layer 230 are exposed at the top of the copper interconnect lines 265. A multiple stage electroless plating method may then be used to form a metal capping layer on the copper interfaces 270.

Figure 2D:
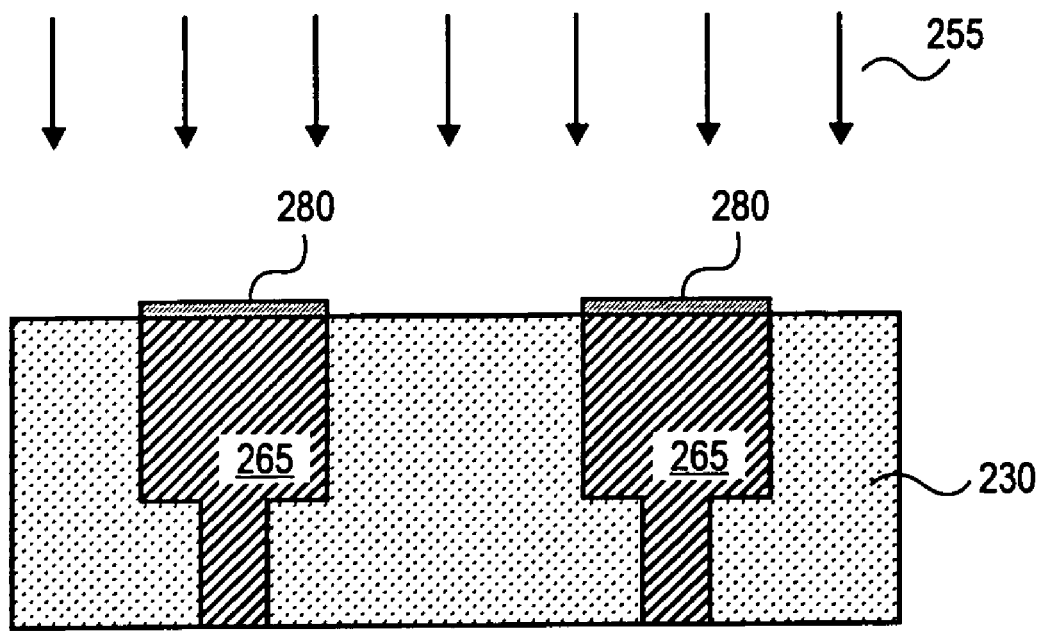

The capping layer 110 as illustrated in FIG. 1 may then be formed on the copper interfaces 270 by a multiple stage electroless plating method where two electroless plating solutions having different chemistries are used. At block 350, a first electroless plating solution 255 may be applied to the metal interfaces 270 to form a first metal film 280 of the metal capping layer 110, as illustrated in FIG. 2d. The first electroless plating solution 255 may contain a highly reactive reducing agent capable of being catalyzed by the metal surface at temperatures of less than 50° C. Examples of such highly reactive activating agents include the boron containing reducing agents dimethylaminoborane (DMAB) and borohydrate compounds that may be catalyzed by a copper metal interface 270 at temperatures of less than 50° C. The temperature of the first electroless plating solution may be in the approximate range of 20° C. and 50° C. In a particular embodiment, the first electroless plating solution 255 may be at a temperature of approximately 25° C. (room temperature). These highly reactive reducing agents may be present in the first electroless plating solution in the concentration in the approximate range of 2 g/l and 30 g/l. The highly reactive activating agents may form a first metal film 280 of the capping layer on the metal interfaces 270 without requiring an activation layer of a noble metal on the metal interfaces 270 because the initial deposition of the first metal film 280 of the capping layer onto the copper interfaces 270 may be autocatalytic. Forming the capping layer 110 without the use of an activation layer is valuable because it may reduce the resistance of copper interconnect lines by up to 50%.

The first electroless plating solution 255 may also contain a metal salt, or metals, to be plated. In one particular embodiment the first electroless plating solution 255 may contain the salt $CoCl_2$ to deposit a first metal film 280 of the capping layer of cobalt. The amount of the metal salt included in the first electroless plating solution 255 may be in the approximate range of 2 g/l and 30 g/l. The deposition rate of the metal may be affected by the following factors: concentration of metal in the plating solution, ratio of metals to complexing agents in the plating solution, pH, and temperature. So, the final deposited thickness of the plated metal layer may be adjusted by the length of deposition time. The first electroless plating solution 255 may also contain salts of metals such as tungsten (W), Chromium (Cr), Molybdenum (Mo), and Rhenium (Re) to form alloys of cobalt.

The first electroless plating solution 255 may also contain a complexing agent. The complexing agent may serve to complex to the metal or metals to be plated in the first electroless plating solution 255 to prevent the precipitation of the metal out of the first electroless plating solution 255. The complexing agent may be a carboxylic acid, or a derivative of carboxylic acid such as citric acid, malonic acid, and lactic acid, or an amine such as ethylenediamine (EDA). In a particular embodiment where the metal in the first electroless plating solution is cobalt, the complexing agent may be citric acid. The amount of complexing agent included in the first electroless plating solution 255 may be a molar ratio of approximately 1:2 to 1:8 of the complexing agent in proportion to the metal to be complexed. The ratio may depend on the type of metal selected in combination with the type of complexing agent selected.

A pH adjuster may also be included in the first electroless plating solution 255. The pH adjustor may be added to maintain the pH of the first electroless plating solution 255 in the approximate range of 7 and 13, and more particularly in the range of 8 and 10 in an embodiment where cobalt is the metal in the solution 255 and citric acid is the complexing agent used in the solution. The pH may be determined by many factors, including the complexing agent, the reducing agent, the substrate, and the activating agent, and may therefore be difficult to predict. Examples of pH adjustors that may be used include tetramethyl ammonium hydroxide (TMAH), ammonium hydroxide, and potassium hydroxide (KOH), but are not limited to the three listed. The amount of pH adjustor added to the first electroless plating solution 255 may depend on the amount of acidic complexing agent added to the solution and on the target pH.

The various elements of the first electroless plating solution 255 may be combined in a solvent or in a combination of solvents. Solvents that may be used include water and ethylene glycol. The amount of solvent used is based on how much solvent is needed to solvate the components of the first electroless plating solution 255 and how large of a volume of the first electroless plating solution is required. In a typical example, the amount of solvent used is 1 liter and the chemical concentrations are normalized to 1 liter of solvent (chemicals volume+solvent=1 liter.) It is to be understood that the compounds within the first electroless plating solution 255 may dissociate and recombine within the solvent to form different compounds.

The first electroless plating solution 255 may be applied to the metal interfaces 270 by spraying or by spinning-on the solution as illustrated in FIG. 2d. In one embodiment the first electroless solution 255 may be sprayed onto the surface of a wafer having metal interfaces 270 at a flow rate in the approximate range of 10 ml/min and 200 ml/min for a time sufficient to coat the surface of the wafer and to form a thin film having a thickness of less than approximately 50 angstroms. The first metal film 280 of the capping layer may be formed to a thickness sufficient to form nucleation sites of the metal being deposited, such as cobalt. The time that the first electroless plating solution 255 is applied may be minimized in order to minimize the exposure of the metal interfaces 270 to the first electroless plating solution 255 but still form nucleations sites of the metal being deposited. In one embodiment, the first electroless plating solution 255 may be sprayed onto the metal interfaces 270 for approximately 20 seconds at a flow rate of approximately 100 ml/min per wafer. It may be valuable to minimize the exposure of the metal interfaces 270 to the highly reactive activating agents, such as DMAB, to prevent the formation of large contaminant particles that may attach to the metal interfaces 270 and ultimately increase the current leakage of the interconnect lines 265 that are capped. It may also be valuable to limit the period that the first electroless plating solution 255 is applied to the metal interfaces 270 because the highly reactive activating agents, such as DMAB and borohydrate, may decrease the effective lifetime of the first electroless plating solution 255 because of the tendency of the highly reactive activating agents to combine with the metal ions within the solution and form large metal particles. Additionally, by forming nucleation sites with the first metal film 280, a noble metal catalytic layer may not be used. By not using a noble metal catalytic layer the resistance of the metal interconnect lines 265 may be reduced by approximately 50% of the resistance value of a metal capping layer formed with a noble metal catalytic layer.

Figure 2E:
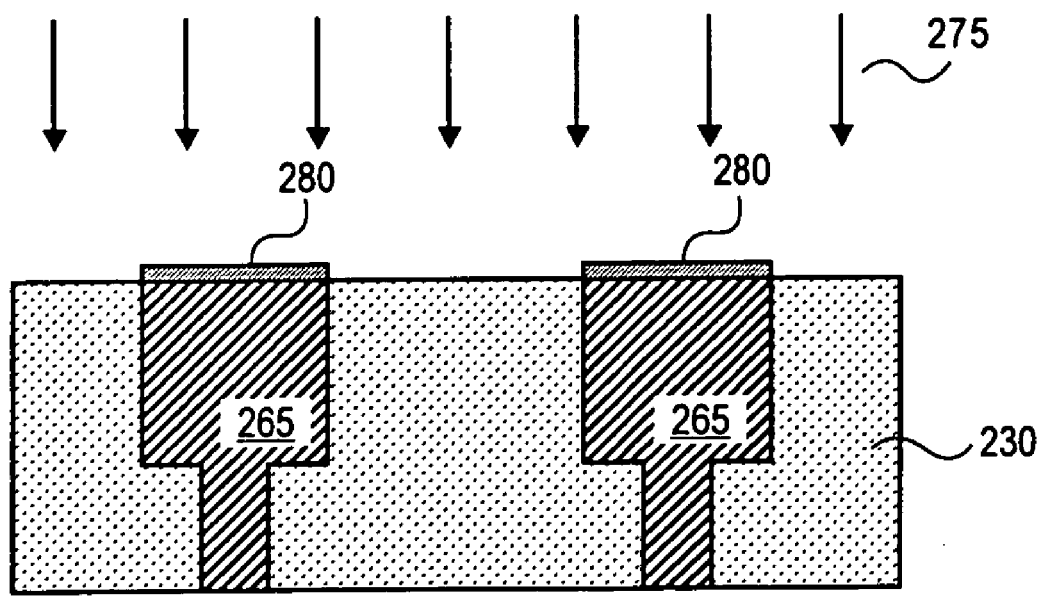
Figure 3:
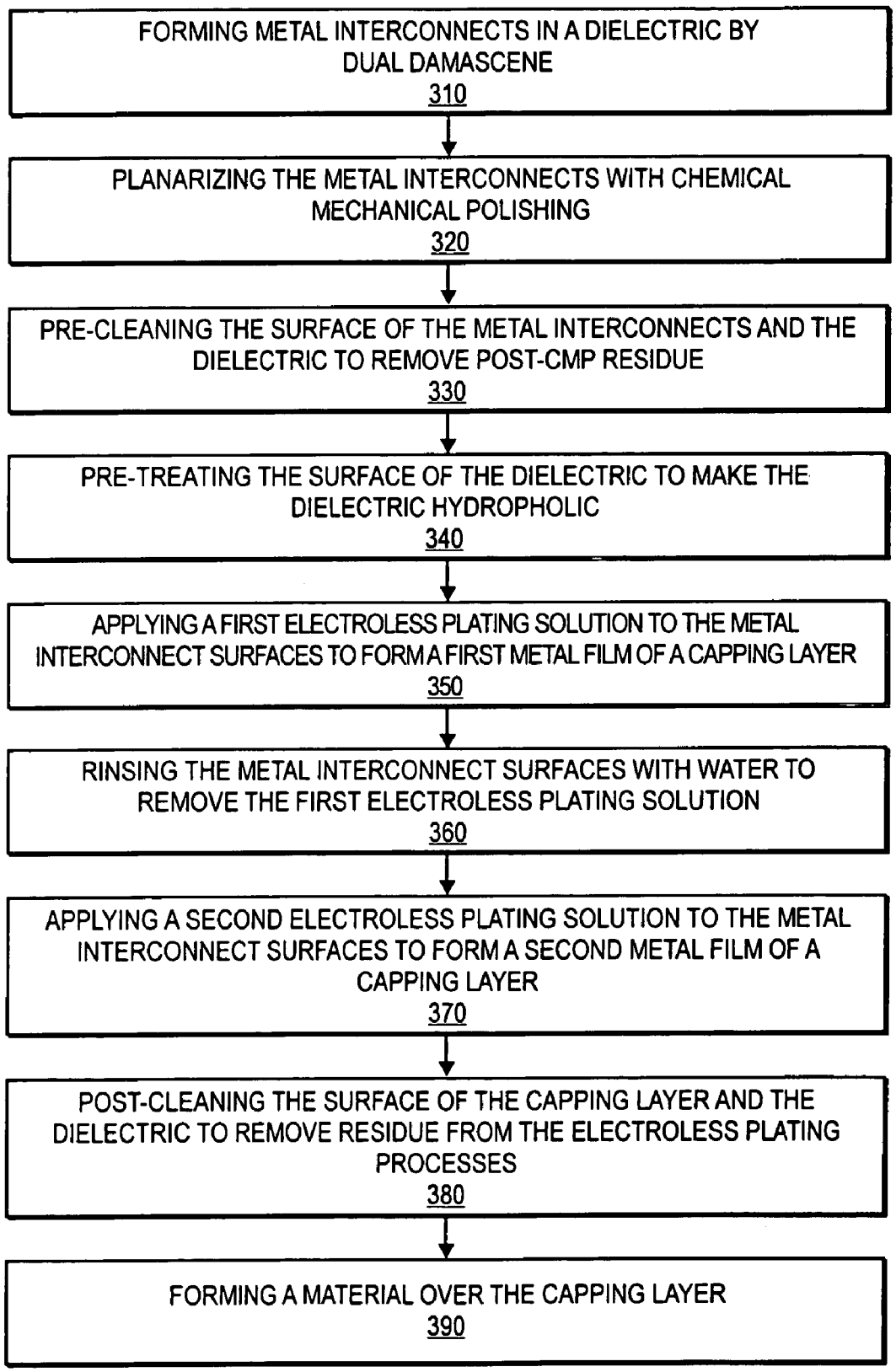
FIG. 3 is a flow chart of a method including the multiple stage electroless deposition method.

At block 360 of FIG. 3, after forming the first metal film 280 of the capping layer, the surface of the metal interfaces 270 and of the dielectric 230 may be rinsed with a rinse solution 275, as illustrated in FIG. 2e, to remove any excess of the first electroless plating solution 255. Removing any excess of the first electroless plating solution 255 may be valuable in preventing the addition of the highly reactive activating agents, such as DMAB, to the second electroless plating solution 225 and thus extending the life of the second electroless plating solution 225. Removing the excess of the first electroless plating solution 255 may also be valuable in minimizing the likelihood that large metal particles formed by the highly reactive activating agents in the first electroless plating solution 255 do not deposit onto the first metal film 280 of the capping layer and increase the current leakage between the metal interconnect lines 265. The rinse solution 275 may be water or a dilute acid such as, but not limited to, sulfuric, acetic, citric or hydrofluoric acid or combination of acids. The rinse solution 275 may be applied by spraying the rinse onto the surface or by immersing the surface in a bath containing the rinse solution. In an embodiment where the rinse solution 275 is sprayed onto the surface, the rinse solution 275 may be sprayed onto a single wafer in the approximate range of 0.5 minutes and 5.0 minutes at a flow rate of approximately 100 ml/min. In an alternate embodiment where a batch of wafers is rinsed, the batch may be sprayed with the rinse solution 275 for approximately 5.0 minutes to 20.0 minutes at a flow rate of approximately 100 ml/min.

After forming the first metal film 280 of the capping layer and optionally rinsing the first metal film 280 of the capping layer 110, a second metal film 290 of the capping layer 110 may be formed at block 370. The second metal film 290 of the capping layer is formed by applying a second electroless plating solution 225 having a different chemical composition than the first electroless plating solution 255. The second electroless plating solution 225 does not contain highly reactive reducing agents capable of being catalyzed by the metal surface to which it is applied at temperatures of less than 50° C. In contrast, the second electroless plating solution 225 contains a mildly reactive reducing agent that is incapable of being catalyzed by the metal surface to which it is applied at temperatures of less than 50° C. Additionally, the mildly reactive reducing agents do not contain boron. Examples of mildly reactive reducing agents include hypophosphite, hydrazine, and formaldehyde. Highly reactive reducing agents such as DMAB and borohydrate are not used in the second electroless plating solution 225 because the nucleation sites formed by the first metal film 280 of the capping layer 110 reduce the activation energy necessary to deposit the second metal film 290 of the capping layer 110 onto the metal interfaces 270. Therefore, the mildly reactive reducing agents of the second electroless plating solution 225 may replace the highly reactive reducing agents of the first electroless plating solution 255. The use of the mildly reactive reducing agents in the second electroless plating solution 225 may extend the lifetime of the second electroless plating solution 225 by greater than one month, and up to several months with replenishment of depleted species. The lifetime of the second electroless plating solution may be extended because the mildly reactive reducing agents do not combine with metals in the solution like the highly reactive reducing agents that do combine with metals in the solution. Therefore, the formation of large metal particles that may deposit on the surface and cause shorts between the metal interconnect lines 265 may be minimized through the use of the second electroless plating solution 225.

The mildly reactive reducing agent may be present in the second electroless plating solution 225 in a concentration in the approximate range of 5 g/l and 40 g/l. The second electroless plating solution 225 may be used to deposit a second metal film 290 of the capping layer 110 that may form the bulk of the entire capping layer 110. The second metal film 290 of the capping layer may have a thickness in the approximate range of 50 angstroms and 500 angstroms, and more particularly a thickness of approximately 150 angstroms.

The second electroless plating solution 225 also contains a salt of the metal, or metals, to be plated. In one particular embodiment the second electroless plating solution may contain the salt $CoCl_2$ to deposit a second metal film 290 of the capping layer 110 of cobalt. The second electroless plating solution 225 may also contain salts of metals such as tungsten (W), Chromium (Cr), Molybdenum (Mo), and Rhenium (Re) to form alloys of cobalt.

The second electroless plating solution 225 may also contain a complexing agent. The complexing agent may serve to complex to the metal or metals to be plated in the second electroless plating solution 225 to prevent the precipitation of the metal out of the second electroless plating solution 225. The complexing agent may be a carboxylic acid, or a derivative of carboxylic acid such as citric acid, malonic acid, and lactic acid, or an amine such as ethylenediamine (EDA). In a particular embodiment where the metal in the second electroless plating solution 225 is cobalt, the complexing agent may be citric acid. The amount of complexing agent included in the second electroless plating solution 225 may be a molar ratio of approximately 1:2 to 1:8 of the complexing agent in proportion to the metal to be complexed, depending on the selection of the metal and complexing agents pairs.

A pH adjuster may also be included in the second electroless plating solution 225. The pH adjustor may be added to maintain the pH of the second electroless plating solution 225 in the approximate range of 7 and 13, and more particularly in the range of 8 and 10 if cobalt is the metal in the second electroless plating solution 225 in combination with citric acid as the complexing agent in the second electroless plating solution 225. The pH may be determined by many factors, including the complexing agent, the reducing agent, the substrate, and the activating agent, and may therefore be difficult to predict. Examples of pH adjustors that may be used include tetramethyl ammonium hydroxide (TMAH), ammonium hydroxide and potassium hydroxide (KOH), but not limited to the three listed. The amount of pH adjustor added to the second electroless plating solution 225 may depend on the amount of acidic complexing agent added to the solution and on the target pH.

The various elements of the second electroless plating solution 225 may be combined in a solvent or in a combination of solvents. Solvents that may be used include water and ethylene glycol. The amount of solvent used is based on how much solvent is needed to solvate the components of the second electroless plating solution 225 and how large of a volume of the second electroless plating solution 225 is required. In a typical example, the amount of solvent used is 1 liter and the chemical concentrations are normalized to 1 liter of solvent (chemicals volume+solvent=1 liter.) It is to be understood that the compounds within the second electroless plating solution 225 may dissociate and recombine within the solvent to form different compounds.

Figure 2F:
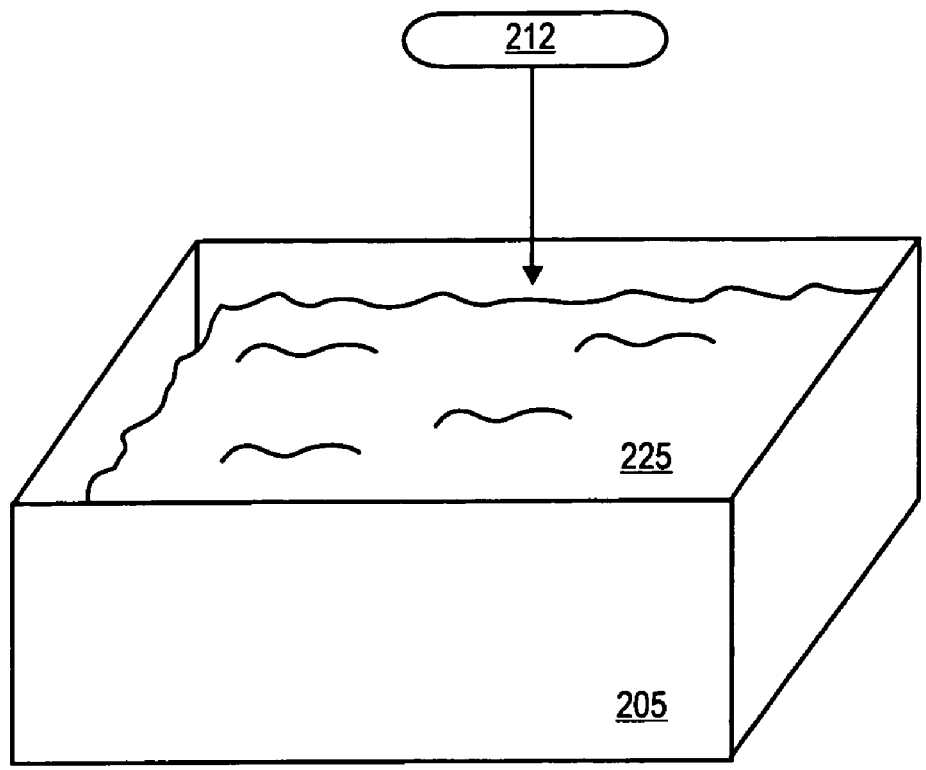
Figure 2G:
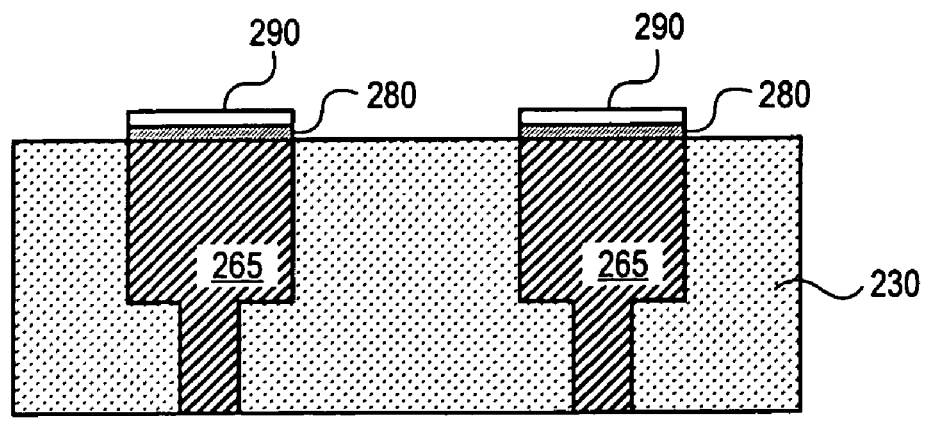

The second electroless plating solution 225 may be applied to the first metal film 280 of the capping layer by immersing the entire substrate, such as a wafer 212, into a bath 205 of the second electroless plating solution 225, as illustrated in FIG. 2f. The wafer 212 may be immersed in the second electroless plating solution 225 for a time in the approximate range of 0.5 minutes and 5.0 minutes to form the second metal film 290 of the capping layer illustrated in FIG. 2g. The deposition rate of the second metal film 290 of the capping layer 110 may be in the approximate range of 5 nm/minute and 20 nm/minute. The second metal film 290 of the capping layer may have a thickness in the approximate range of 50 angstroms and 500 angstroms, and may therefore form the bulk of the entire capping layer. In one particular embodiment, the second metal film 290 of the capping layer may have a thickness of approximately 150 angstroms.

Figure 2H:
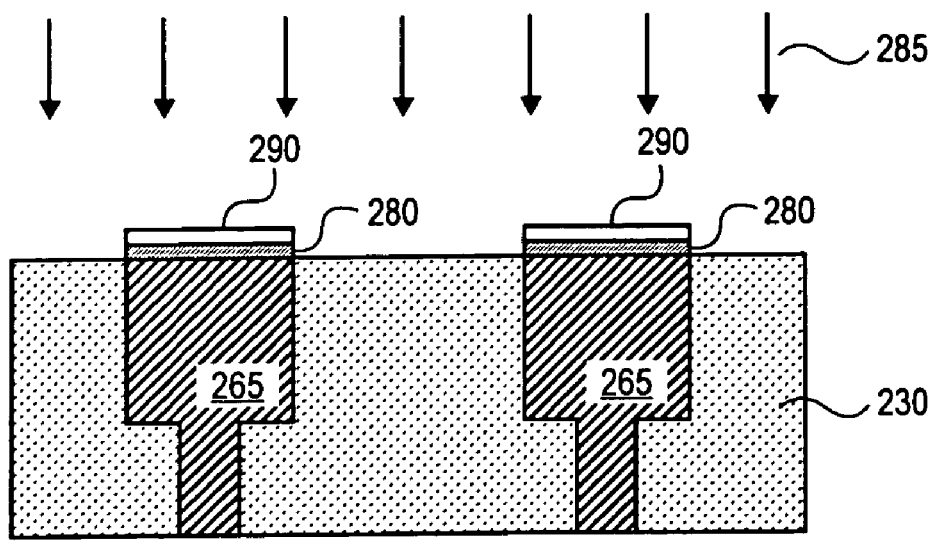

At block 380, after forming the second metal film 290 of the capping layer 110, the surface of the second metal film 290 of the capping layer and the dielectric 230 may be cleaned with a solution 285 to remove post-plating impurities, as illustrated in FIG. 2h. The solution 285 may be an acid such as sulfuric acid, citric acid, or hydrofluoric acid diluted in water to form a mild acid rinse. The solution 285 may be applied to the second metal film 290 of the capping layer by spray or by immersion of the substrate into a bath of the solution 285. The solution 285 may be applied to the substrate for a time sufficient to remove the post-plating impurities, but not so long a time as to dissolve the capping layer.

Figure 2I:
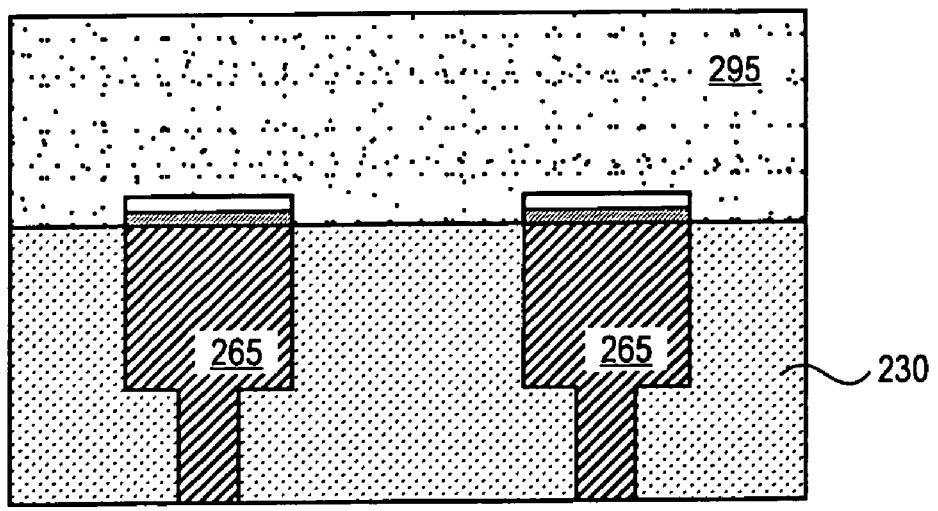

A material 295 may be formed over the capping layer 110 and the dielectric 230 as at block 390 and as illustrated in FIG. 2i. In an embodiment, the material 295 may be an interlayer dielectric that is a low k dielectric such as SiOF, carbon doped oxide (CDO), porous oxide, or organic materials. The expression low k dielectric constant material refers to a material having a dielectric constant lower than the dielectric constant of silicon dioxide and specifically less than around 4.0. In another embodiment, the material 295 may be a hard mask or an etch stop material such as silicon dioxide or silicon nitride.

Several embodiments of the invention have thus been described. However, those of ordinary skill in the art will recognize that the invention is not limited to the embodiments described, but can be practiced with modification and alteration within the scope and spirit of the appended claims that follow.

We claim:

1. A method of forming an interconnect capping layer for a device, comprising:
    spraying a first plating solution comprising dimethylaminoborane onto an interconnect to form a first portion having a first thickness; and
    after the spraying, immersing the interconnect into a second plating solution comprising hypophosphite or formaldehyde to form a second portion having a second thickness on the first portion.

2. The method of claim 1, wherein the second portion is formed over the first portion.

3. The method of claim 1, wherein the second portion is formed directly on the first portion.

4. The method of claim 1, wherein the first thickness is less than the second thickness.

5. The method of claim 1, wherein the first thickness is approximately equal to the second thickness.

6. The method of claim 1, wherein spraying the first plating solution comprises spraying the first plating solution at a temperature less than 50° C 7. The method of claim 1, wherein immersing the interconnect into the second plating solution comprises immersing the interconnect into the second plating solution at a temperature less than 50° C.

* * * * *

UNITED STATES PATENT AND TRADEMARK OFFICE
CERTIFICATE OF CORRECTION

| | |
|---|---|
| PATENT NO. | : 7,285,494 B2 |
| APPLICATION NO. | : 11/192501 |
| DATED | : October 23, 2007 |
| INVENTOR(S) | : Cheng et al. |

It is certified that error appears in the above-identified patent and that said Letters Patent is hereby corrected as shown below:

In column 2, at line 7, after "within" insert --an--.

In column 10, at line 3, after "C" insert --.--.

Signed and Sealed this

Third Day of June, 2008

JON W. DUDAS
*Director of the United States Patent and Trademark Office*